United States Patent [19]

Kobayashi

[11] Patent Number: 4,748,440

[45] Date of Patent: May 31, 1988

[54] ANALOG-TO-DIGITAL CONVERSION SYSTEM

[75] Inventor: Osamu Kobayashi, Yokohama, Japan

[73] Assignee: Fujitsu Limited, Kawasaki, Japan

[21] Appl. No.: 902,586

[22] Filed: Sep. 2, 1986

[30] Foreign Application Priority Data

Sep. 2, 1985 [JP] Japan .................... 60-192039

[51] Int. Cl.$^4$ .................... H03M 1/00
[52] U.S. Cl. .................... 340/347 AD
[58] Field of Search .................... 340/347 AD, 347 DD

[56] References Cited

U.S. PATENT DOCUMENTS 3,308,284  3/1967  Grubb .................... 340/347 DD
3,842,413  10/1974  Lagarde .................... 340/347 AD Primary Examiner—William M. Shoop, Jr.
Assistant Examiner—Richard K. Blum
Attorney, Agent, or Firm—Staas & Halsey

[57] ABSTRACT

In an analog-to-digital conversion system, the system includes: a voltage conversion circuit selectively obtaining at least three kinds of conversion voltages, i.e., a first conversion voltage which is double the input voltage, a second conversion voltage which subtracts a reference voltage from the first conversion voltage, and a third conversion voltage which adds the reference voltage to the first conversion voltage; a comparison circuit using at least two decision level voltages and comparing the input voltage with each of the decision level voltages, then outputting the command signal as a result of a comparisons to the voltage conversion circuit so that the voltage conversion circuit outputs one of the conversion voltages in response to the command signal; and a control circuit for changing the connections of switch contacts provided in the voltage conversion circuit in response to the result of the comparisons by the comparison circuit.

16 Claims, 15 Drawing Sheets

Fig. 12  PRIOR ART

| INPUT | | | | OUTPUT | | | | | |
|---|---|---|---|---|---|---|---|---|---|
| | | | | CO="L" / C2="L" | | | CO="H" / C2="H" | | |
| A1/A3 | B1/B3 | A2/A4 | B2/B4 | Σ1/Σ3 | Σ2/Σ4 | C2/C4 | Σ1/Σ3 | Σ2/Σ4 | C2/C4 |
| L | L | L | L | L | L | L | H | L | L |
| H | L | L | L | H | L | L | L | H | L |
| L | H | L | L | H | L | L | L | H | L |
| H | H | L | L | L | H | L | H | H | L |
| L | L | H | L | L | H | L | H | H | L |
| H | L | H | L | H | H | L | L | L | H |
| L | H | H | L | H | H | L | L | L | H |
| H | H | H | L | L | L | H | H | L | H |
| L | L | L | H | L | H | L | H | H | L |
| H | L | L | H | H | H | L | L | L | H |
| L | H | L | H | H | H | L | L | L | H |
| H | H | L | H | L | L | H | H | L | H |
| L | L | H | H | L | L | H | H | L | H |
| H | L | H | H | H | L | H | L | H | H |
| L | H | H | H | H | L | H | L | H | H |
| H | H | H | H | L | H | H | H | H | H |

Fig. 15

| $V_x$ | | $V_x < -\dfrac{V_{REF}}{4}$ | $-\dfrac{V_{REF}}{4} \leq V_x < \dfrac{V_{REF}}{4}$ | $\dfrac{V_{REF}}{4} \leq V_x$ |
|---|---|---|---|---|
| OUT-PUT | CPR1 | L | L | H |
| | CPR2 | L | H | H |
| $V_3$ | | ⌐_ | — | _⌐ |
| $V_5$ | | ⌐_ | — | _⌐ |
| $V_1$ | | ⊓⌐ | ⊓⌐ | ⊓⌐ |
| $V_x$ | | $2V_y + V_{REF}$ | $2V_y$ | $2V_y - V_{REF}$ |
| | | 0 | 0 | 0 |
| $V_y$ | | 0 | 0 | 0 |
| | | PREVIOUS $V_x$ | PREVIOUS $V_x$ | PREVIOUS $V_x$ |

Fig. 16

| INPUT VOLTAGE Vi | OUTPUT CODE (DB15~0) |
|---|---|
| $\geq +V_R$ | 0111 1111 1111 1111 |
| $+V_R - 1LSB$ | 0111 1111 1111 1111 |
| $+V_R/2$ | 0100 0000 0000 0000 |
| 0 | 0000 0000 0000 0000 |
| $-1LSB$ | 1111 1111 1111 1111 |
| $-V_R/2$ | 1100 0000 0000 0000 |
| $-V_R + 1LSB$ | 1000 0000 0000 0001 |
| $\leq -V_R$ | 1000 0000 0000 0001 |

4,748,440

ANALOG-TO-DIGITAL CONVERSION SYSTEM

BACKGROUND OF THE INVENTION

1. Field of the Invention

The present invention relates to an analog-to-digital conversion system.

2. Description of the Related Art

Conversion of an analog value, for example, an analog voltage, to digital codes is usually performed in the field of measurements. In general, it is necessary that the requirements of the conversion method comprise such characteristics as a high conversion speed, high resolution, small power consumption, and small quantizing errors. A well known technique is that a cyclic analog-to-digital (A/D) conversion method is used in the analog-to-digital conversion circuit. This circuit is usually constituted by an integrated circuit (IC). In the conventional cyclic A/D conversion method, only one decision level voltage is applied to a comparator from an external circuit. An analog input voltage is sequentially compared with this decision level voltage, then code conversions are performed based on the generated digits obtained from resultant data of the comparison.

There are however, problems regarding the decision level voltage which is applied from the external circuit. That is, it is difficult to set the decision level voltage within the predetermined range of the offset value caused by, for example, characteristic fluctuations of circuit elements. The larger the offset value, the more errors in the generated digit. These problems will be explained in detail hereinafter.

SUMMARY OF THE INVENTION

The object of the present invention is to provide an analog-to-digital conversion method enabling high speed conversion, high resolution and small quantizing errors regardless of the offset value of the decision level voltage when an analog value is converted to digital codes.

In accordance with the present invention, there is provided an analog-to-digital conversion system including: a voltage conversion circuit selectively obtaining at least three kinds of conversion voltages, i.e., a first conversion voltage which doubles the input voltage, a second conversion voltage which subtracts a reference voltage from the first conversion voltage, and a third conversion voltage which adds the reference voltage to the first conversion voltage; a comparison circuit setting at least two decision level voltages and comparing the input voltage with each of those decision level voltages, then outputting a command signal as a result of the comparison to the voltage conversion circuit so that the voltage conversion circuit outputs one of the conversion voltages in response to the command signal; and a control circuit for changing the connections of switch contacts provided in the voltage conversion circuit in response to the result of the comparison by the comparison circuit.

BRIEF DESCRIPTION OF THE DRAWINGS

In the drawings:

FIG. 12 is a function chart of the circuit shown in FIG. 11, FIG. 15 is a chart for explaining patterns of the voltages of FIG. 14, and FIG. 16 is a chart for explaining a conversion range and output codes of the A/D conversion in the best mode.

DESCRIPTION OF THE PREFERRED EMBODIMENTS

Figure 1:
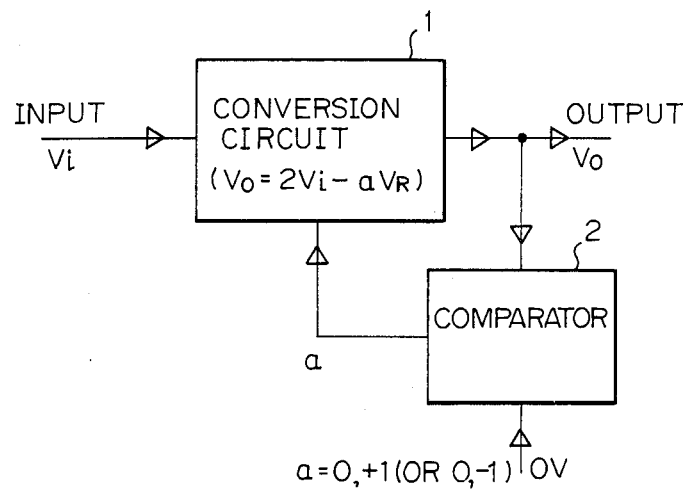
FIG. 1 is a partial block diagram of a conventional analog-to-digital conversion system.

Before describing the preferred embodiments, an explanation will be given of a conventional analog-to-digital conversion system. Referring to FIG. 1, reference numeral 1 represents a voltage conversion circuit for converting an input voltage $V_i$ to an output voltage $V_o$ based on a predetermined formula. Reference number 2 represents a comparator for comparing the output voltage $V_o$ with a decision level voltage. The decision level voltage, for example, 0 V, is input to the comparator 2 from an external circuit (not shown). $V_R$ represents a reference voltage for converting the input voltage $V_i$ to the output voltage $V_o$. A command signal generated from the comparator 2 to the conversion circuit 1 is represented by a. The signal a takes two states $(0, +1)$ or $(0, -1)$ based on the decision level voltage 0 V. The control method using these two values is called "two states control".

In the conversion circuit, the output voltage $V_o$ is calculated by the predetermined formula, i.e., $V_o = 2 \cdot V_i - a \cdot V_R$. In this case, as explained in detail hereinafter, although the input voltage $V_i$ is an external voltage in the first stage of the calculation, the resultant data $V_o$ is used as the $V_i$ in the next stage of the calculation. This calculation is continued until the resultant data $V_o$ becomes zero. In each stage of the calculation, the resultant data $V_o$ is compared with the decision level voltage (for example, 0 V).

This method is called a cyclic A/D conversion method. As is obvious from the above explanation, only one decision level voltage (for example 0 V) is used as a judgement reference level.

Figure 2:
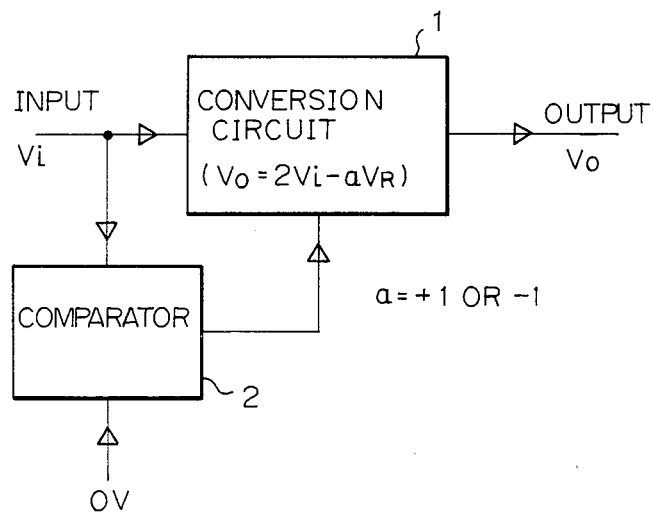
FIG. 2 is a partial block diagram of an another conventional analog-to-digital conversion system.

Referring to FIG. 2, the decision level voltage is also set to 0 V. Moreover, the input voltage $V_i$ is compared with this decision level voltage in the input side by the comparator 2. In this case, the same formula ($V_o=2V_i-a\cdot V_R$) as the first conventional circuit is used as the conversion formula, and only one decision level voltage (for example, 0 V) is also used as the judgement reference level. That is, when the voltage $V_i$ is larger than the 0 V, the command signal a is "+1". Conversely, when the voltage $V_i$ is smaller than the 0 V, the command signal a is "−1". In this case, the same cyclic A/D conversion method as explained in FIG. 1 is used for obtaining the conversion voltage.

Figure 3:
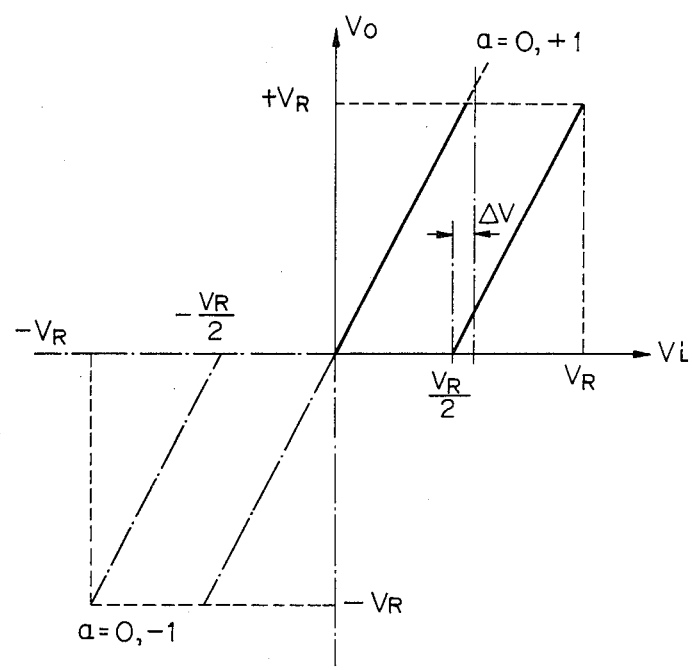
FIG. 3 is a characteristic diagram of an input/output voltage of the circuit shown in FIG. 1.

Referring to FIG. 3, in practice the first quadrant area is used for conversion (i.e., a positive analog voltage is converted to digital codes). In this case, the range of the input voltage $V_i$ is 0 to $V_R$ (V) and the range of the quantizing error is 0 to 1LSB. The quantizing error is a bit error always occurring when the voltage value is converted to the digital value. "LSB" is the least significant bit. The turning over voltage is set to $V_R/2$, and when $V_i$ is larger than $V_R/2$, the signal a is "+1". Conversely, when $V_i$ is smaller than $V_R/2$, the signal a is "0". Accordingly, in this area, the output voltage $V_o$ is shown by $2V_i$ (a=0) or by $2V_i-V_R$ (a=+1).

However, since there is an offset $\Delta V$ of the turning over voltage $V_R/2$, the range in which it is impossible to convert from the input voltage to the output voltage occurs in the range of the output voltage $V_o$, as shown by dotted line. This will be explained in detail with reference to FIG. 4.

Figure 4:
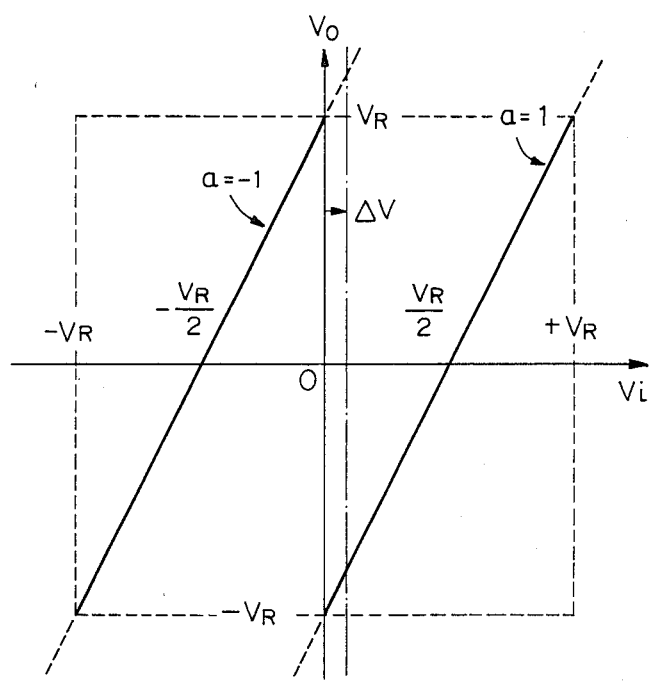
FIG. 4 is an another characteristic diagram of an input/output voltage of the circuit shown in FIG. 2.

Referring to FIG. 4, two input/output characteristic lines represent $V_o=2V_i-V_R$ (a=1) and $V_o=2V_i+V_R$ (a=−1). In this case, the range of the input voltage $V_i$ is $-V_R$ to $+V_R$ and the range of quantizing error is −1 to +1LSB. The command signal a is "−1" or "+1" in the two states control. This type of conversion is used for both positive and negative analog voltages.

As explained above, since there is the offset voltage $\Delta V$ of the decision level voltage 0 V, the range in which it is impossible to convert from the input voltage to the output voltage occurs in the range of the output voltage $V_o$ as an "over range". That is, the output voltage $V_o$ in the range of 0 to $\Delta V$ of the input voltage $V_i$ exceeds the reference voltage $V_R$, as shown by dotted line. This is because the command signal a is "−1" in this range although a is "1" if no offset voltage $\Delta V$ is found.

The offset of the decision level voltage is always brought about by fluctuations of electrical values of the circuit elements and by the conditions of the circuit arrangement in the comparator. Meanwhile, the smaller the offset voltage, the better the condition of the decision level voltage in the use of the comparator. there is, however, a limitation to the offset voltage caused by the above explained fluctuations and conditions.

Another problem lies in the larger quantizing error. The smaller the quantizing error, the better the conversion to digital codes. However, in this input voltage range, the quantizing error lies in the range of −1 to 1LSB.

Figure 5:
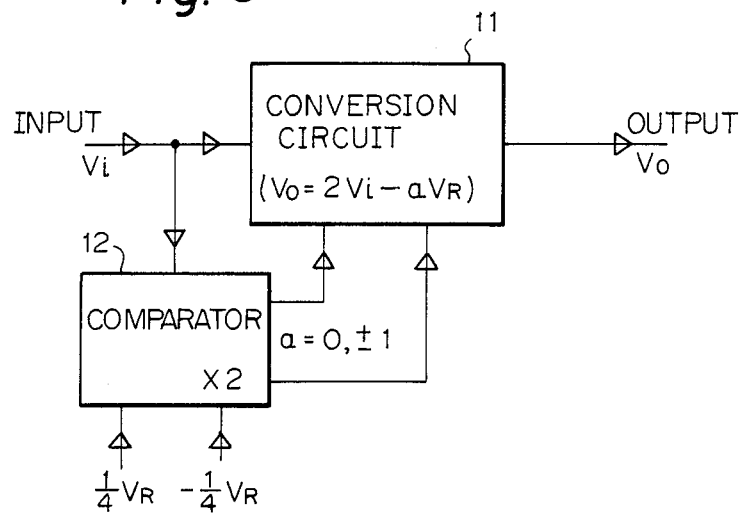
FIG. 5 is a partial block diagram of an analog-to-digital conversion system according to an embodiment of the present invention.

An analog-to-digital conversion method according to the present invention will be explained in detail hereinafter. Referring to FIG. 5, reference number 11 represents a conversion circuit, and 12 a comparator. In the comparator 12, two decision level voltages, for example, $V_R/4$ and $-V_R/4$, are applied as the judgement reference levels. This type corresponds to the circuit shown in FIG. 2. Accordingly, when the input voltage $V_i$ is larger than $V_R/4$, the command signal a is "+1", when the input voltage $V_i$ is in the range of $V_R/4$ to $-V_R/4$, the signal a is "0", and when the input voltage $V_i$ is smaller than $-V_R/4$, the signal a is "−1". The control method of this type is called "three states control".

The same conventional formula is applied to the conversion circuit 11. That is, the conversion formula from the input voltage to the output voltage is shown by the formula $V_o=2V_i-a\cdot V_R$. Since the same cyclic A/D conversion method as the conventional one is used, the same calculations are performed in the conversion circuit 11. Accordingly, three formulae, i.e., $V_o=2V_i-V_R$, $V_o=2V_i$, and $V_o=2V_i+V_R$, are given in correspondence with a=+1, 0, and −1 as the "three state control".

Figure 6:
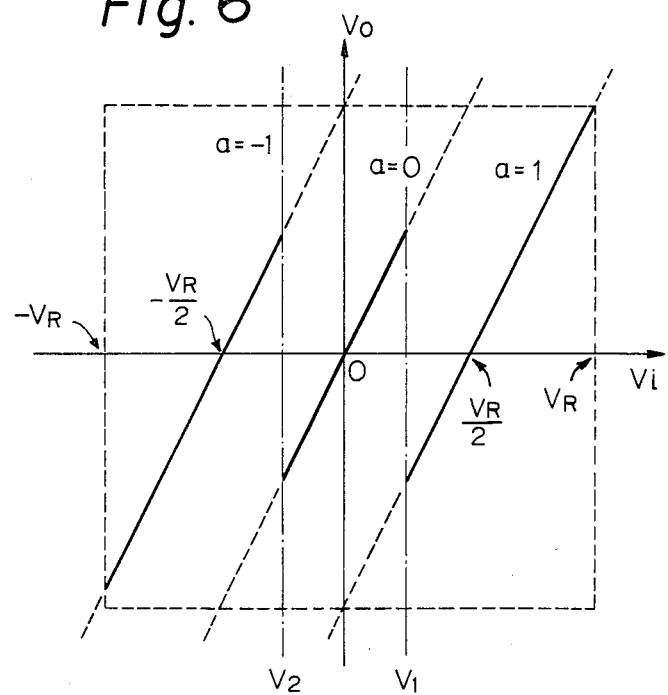
FIG. 6 is a characteristic diagram of input/output voltage of the circuit shown in FIG. 5, FIGS. 7A to 7D and detailed circuits of the conversion circuit according to an embodiment of the present invention.

Referring to FIG. 6, three characteristic lines are shown by the formula $V_o=2V_i-V_R$ (when a=1), $V_o=2V_i$ (when a=0), and $V_o=2V_i+V_R$ (when a=−1). The decision level voltage $V_1$ is set to, for example, approximately $V_R/4$ and the decision level voltage $V_2$ is set to, for example, approximately $-V_R/4$. As is obvious from the diagram, the input/output characteristic line is divided into three lines based on two decision level voltages. Conventionally, the input/output characteristic line is divided into two lines as shown in FIGS. 3 and 4, based on only one decision level voltage.

As is obvious from the graph, the input voltage $V_i$ is in the following range. That is, $$-V_R \leq V_i \leq 0 \quad \text{when } a = -1$$
$$-V_R/2 \leq V_i \leq V_R/2 \quad \text{when } a = 0$$
$$0 \leq V_i \leq V_R \quad \text{when } a = 1$$

Accordingly, the decision level voltages $V_1$ and $V_2$ can be set to the following range. That is, $$0 \leq V_1 \leq V_R/2$$
$$-V_R/2 \leq V_2 \leq 0$$

Therefore, the decision level voltages $V_1$ and $V_2$ may be set to approximately central values in the above ranges. That is, $$V_1 \approx V_R/4$$
$$V_2 \approx -V_R/4$$

In this case, the fluctuation values $\pm V_R/4$ can be allowed as margin of the above decision level voltages because the output voltage $V_o$ does not exceed the possible conversion range ($V_R$ to $-V_R$) in the range of the decision level voltages $V_1$ and $V_2$ ($0 \leq V_1 \leq V_R/2$ and $-V_R/2 \leq V_2 \leq 0$). Therefore, an offset voltages can be allowed in the range of $\pm V_R/4$. These values are sufficiently large to cope with fluctuations by the elements.

Next, the effect of the quantizing error will be explained below.

Regarding the decision level voltage $V_1$, the input voltage $V_i$ is given by, $$V_i = V_1 = \frac{V_R}{4}(1 + \Delta_1)$$

where, $\Delta_1$ is a fluctuation rate of $V_1$.

Accordingly, the converted output voltages $V_o$ when the signal a is "0" and "1" are shown by following formula.

$$V_o = 2 \cdot \frac{V_R}{4} (1 + \Delta_1) \quad \text{when } a = 0$$
$$= \frac{V_R}{2} (1 + \Delta_1)$$
$$V_o = 2 \cdot \frac{V_R}{4} (1 + \Delta_1) - V_R \quad \text{when } a = 1$$
$$= -\frac{V_R}{2} (1 - \Delta_1)$$

Regarding the decision level voltage $V_2$, the input voltage $V_1$ is given by, $$V_i = V_2 = -\frac{V_R}{4} (1 + \Delta_2)$$

where, $\Delta_2$ is a fluctuation rate of $V_2$.

Accordingly, the converted output voltage $V_o$ when the signal a is "0" and "−1" is shown by the following formulas.

$$V_o = -\frac{V_R}{2} (1 + \Delta_2) \text{ when } a = 0$$
$$V_o = -\frac{V_R}{2} (1 - \Delta_2) \text{ when } a = -1$$

Therefore, the maximum value of the quantizing error (absolute value) is given by the following formula.

$$\text{LSB}/2 \times (1 + \max[|\Delta_1|, |\Delta_2|])$$

Accordingly, if the fluctuation rate is "x"%, the quantizing error becomes $\frac{1}{2}\text{LSB}(1+x/100)$.

Next, the explanation will be given regarding the quantizing error in the vicinity of the voltage $\pm V_R$. In this case, the following formula is given in the vicinity of the voltage $\pm V_R$.

$$V_i = V_R - \Delta V_x$$

where, $\Delta V_x$ is the fluctuation rate from the end value $V_R$. The normalized above formula is given as follows.

$$X_0 = 1 - \Delta X$$

where, $X_0$ is the normalized $V_i$ by $V_R$, and $\Delta X$ is the normalized $\Delta V_x$ by $V_R$. Accordingly, since $a=1$, $X_0 \approx 1$, the formula is given as follows.

$$X_n = 2 \cdot X_{n-1} - 1$$
$$X_n - 1 = 2(X_{n-1} - 1)$$
$$= 2^n (X_0 - 1)$$
$$= -2^n \cdot \Delta X$$
$$\therefore X_n = 1 - 2^n \cdot \Delta X$$

This formula is equivalent to the quantizing error when n bits conversions are completed.

As the conditions of $X_n \leq \frac{1}{2}$, in the following formula is given, $$2^n \cdot \Delta X \geq \frac{1}{2}$$
$$\Delta X \geq \frac{1}{2^{n+1}}$$
$$\therefore |X_0| \leq 1 - \frac{1}{2^{n+1}} = 1 - \frac{1}{2} \text{LSB}$$

Therefore, in the vicinity of the voltage $\pm V_R$, the quantizing error always becomes less than the value $\frac{1}{2}$LSB.

The effect of the present invention will be explained by using actual data in comparison with the conventional art.

In the cyclic A/D conversion, the reference voltage $V_R$ is given by 1 (V) and the input voltage $V_i$ is given by 7/16 (V).

(1). In the case of a non-fluctuation rate of the decision level voltage.

A. In the conventional art (see: FIGS. 2, 4)
The decision level voltage: 0 (V)
The conventional formula:

$$V_o = 2V_i - V_R \quad (a = 1)$$
$$V_o = 2V_i + V_R \quad (a = -1)$$

step 1: $V_i = 7/16 \geq 0$    digit: 1
$V_o = 2V_i - 1 = -\frac{1}{8}$
step 2: $V_i = -\frac{1}{8} < 0$    digit: −1
$V_o = 2V_i + 1 = \frac{3}{4}$
step 3: $V_i = \frac{3}{4} > 0$    digit: 1
$V_o = 2V_i - 1 = \frac{1}{2}$
step 4: $V_i = \frac{1}{2} > 0$    digit: 1
$V_o = 2V_i - 1 = 0$ Accordingly, the generated digits are obtained as follows.
Generated digits: 1 −1 1 1
Plus/minus code conversions of this data are performed as follows.

$$\begin{array}{r} 1\ 0\ 1\ 1 \\ -)\ 0\ 1\ 0\ 0 \\ \hline 0\ 1\ 1\ 1 \end{array} = 7/16$$

B. In the present invention (see: FIGS. 5, 6)
Two decision level voltages: $-V_R/4$, $V_R/4$
The conversion formula:

$$V_o = 2V_i - V_R \quad (a = 1)$$
$$V_o = 2V_i \quad (a = 0)$$
$$V_o = 2V_i + V_R \quad (a = -1)$$

step 1: $V_i = 7/16 \geq \frac{1}{4}$    digit: 1
$V_o = 2V_i - 1 = -\frac{1}{8}$
step 2: $\frac{1}{4} > V_i = -\frac{1}{8} \geq -\frac{1}{4}$    digit: 0
$V_o = 2V_i = -\frac{1}{4}$
step 3: $\frac{1}{4} > V_i = -\frac{1}{4} \geq -\frac{1}{4}$    digit: 0
$V_o = 2V_i = -\frac{1}{2}$
step 4: $-\frac{1}{4} > V_i = -\frac{1}{2}$    digit: −1
$V_o = 2V_i + 1 = 0$ Accordingly, the generated digits are obtained as follows.

Generated digits: 1 0 0 −1 /

Plus/minus code conversion of this data are performed as follows.

$$\begin{array}{r}1000\\-\underline{)0001}\\\overline{0111}\end{array} = 7/16$$

(2). In the case of a fluctuation rate $\Delta V = \frac{1}{8}$ of the decision level voltage.

A. In the conventional art (see: FIGS. 2, 4)

The decision level voltage is changed from 0 (V) to $-\frac{1}{8}$ (V).

step 1:   $V_i = 7/16 \geq -\frac{1}{8}$     digit: 1
         $V_o = 2V_i - 1 = -\frac{1}{8}$ step 2:   $V_i = -\frac{1}{8} \geq -\frac{1}{8}$     digit: 1
         $V_o = 2V_i - 1 = -5/4$    ("over range")

This value (−5/4) means "over range", as shown by the dotted line in FIG. 4.

step 3:   $V_i = -5/4 < -\frac{1}{8}$     digit: −1
         $V_o = 2V_i + 1 = -3/2$    (over range)

step 4:   $V_i = -3/2 < -\frac{1}{8}$     digit: −1

Accordingly, the generated digits are obtained as follows.

Generated digits: 1 1 −1 −1

Plus/minus code conversions of generated digits are performed as follows.

$$\begin{array}{r}1100\\-\underline{)0011}\\\overline{1001}\end{array} = 9/16$$

data error

This data is an error and should become 7/16, as explained above.

B. In the present invention (see: FIGS. 5, 6)

Two decision level voltages: $-V_R/8$, $V_R/8$ step 1:   $V_i = 7/16 \geq \frac{1}{8}$     digit: 1
         $V_o = 2V_i - 1 = -\frac{1}{8}$ step 2:   $\frac{1}{8} > V_i = -\frac{1}{8} \geq -\frac{1}{8}$     digit: 0
         $V_o = 2V_i = -\frac{1}{4}$ step 3:   $V_i = -\frac{1}{4} < -\frac{1}{8}$     digit: −1
         $V_o = 2V_i + 1 = \frac{1}{2}$ step 4:   $V_i = \frac{1}{2} \geq \frac{1}{8}$     digit: 1
         $V_o = 2V_i - 1 = 0$ (not over range)

Accordingly, the generated digits are obtained as follows.

Generated digits: 1 0 −1 1

Plus/minus code conversions of this data are performed as follows.

$$\begin{array}{r}1001\\-\underline{)0010}\\\overline{0111}\end{array} = 7/16$$

This data is correct.

As explained above, regardless of fluctuations of the decision level voltage, the conversion can be correctly performed.

Figure 7A:
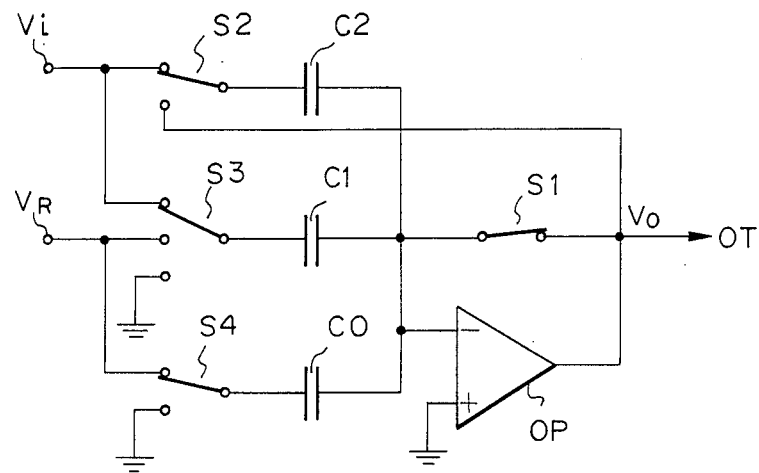

Referring to FIGS. 7A to 7D, each circuit comprises an operational amplifier OP, three capacitors C0 to C2 and four switches S1 to S4. The differences between these figures lie in the connections of the switches S1 to S4. Each of the capacitors C0 to C2 has an approximately equal capacitance. The circuit shown in FIG. 7A is used as the sampling operation of the input voltage $V_i$. The circuits shown in FIGS. 7B to 7D and used as the conversion from the input voltage to the output voltage. By changing the connections of these switches, the following output voltages $V_o$ can be obtained in the output terminal OT. that is, $$V_o = 2V_i - V_R \tag{1}$$

$$V_o = 2V_i \tag{2}$$

$$V_o = 2V_i + V_R \tag{3}$$

Figure 7B:
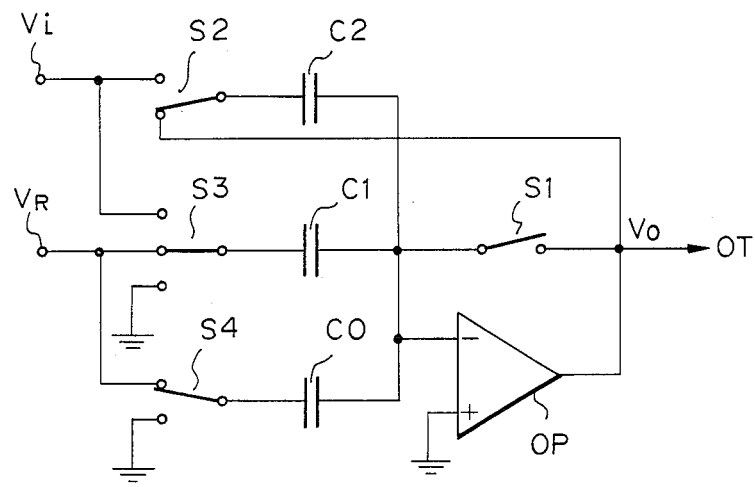

A. In FIG. 7A, the sampling of the input voltage $V_i$ is performed as follows.

switch S1: ON
switch S2: to $V_i$
switch S3: to $V_i$
switch S4: to $V_R$
capacitor C0: charged by $V_R$
capacitor C1: charged by $V_i$
capacitor C2: charged by $V_i$ B. In FIG. 7B, the conversion of "$-V_R$" is performed as follows.

switch S1: OFF
switch S2: to terminal OT
switch S3: to $V_R$
switch S4: to $V_R$
capacitor C0: charged by $V_R$
capacitor C1: charged by $V_R$
capacitor C2: charged by $2V_i - V_R$ In this case, the electric charge quantity of the capacitor C2 is given by $2V_i - V_R$, based on "the principle of conservation of the electric charge". That is, although the electric charge quantity of the capacitor C0 is not charged, that of the capacitor C1 is changed to $V_R$. Accordingly, the charge quantity $V_i - V_R$ in the capacitor C1 is migrated to the capacitor C2, based on the above "principle". Therefore, the electric charge quantity of the capacitor C2 is given by, $$V_i + V_i - V_R = 2V_i - V_R$$

In this case, although each electric charge quantity is given by multiplying the capacitance by the voltage, i.e., $C \times V$, these capacitances are omitted in the descriptions since the capacitances of each of the capacitors C0, C1 and C2 are equal.

Figure 7C:
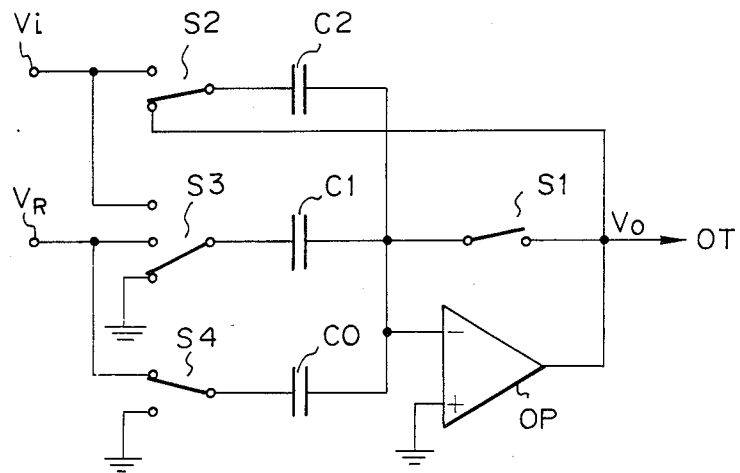

C. In FIG. 7C, the conversion of "0" is performed as follows.

switch S1: OFF
switch S2: to terminal OT switch S3: to ground
switch S4: to $V_R$
capacitor C0: charged by $V_R$
capacitor C1: to ground
capacitor C2: charged by $2V_i$ In this case, the electric charged quantity of the capacitor C2 is given by $2V_i$, based on the above "principle". That is, although the charge quantity of the capacitor C0 is held, that of the capacitor C1 is migrated to the capacitor C2, based on the above "principle". Therefore, the electric charged quantity of C2 is given by, $$V_i + V_i = 2V_i$$

Figure 7D:
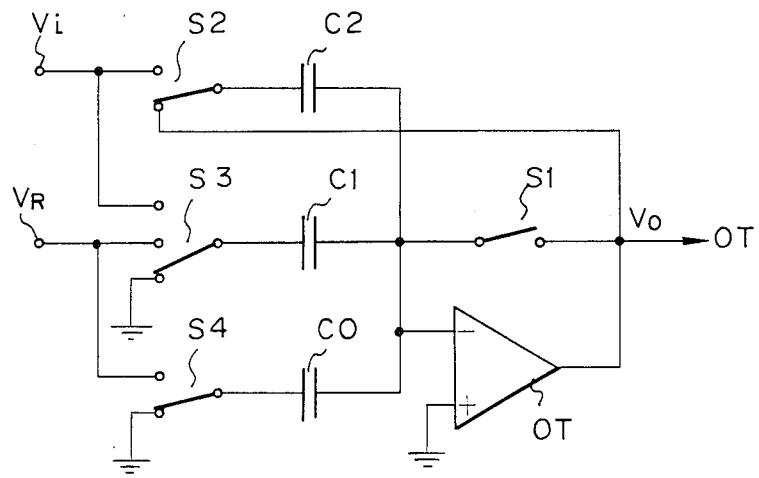

D. In FIG. 7D, the conversion of "$+V_R$" is performed as follows.
switch S1: OFF
switch S2: to terminal OT
switch S3: to ground
switch S4: to ground
capacitor C0: to ground
capacitor C1: to ground
capacitor C2: charged by $2V_i + V_R$ In this case, as explained above, the electric charge quantities of the capacitors C0 and C1 and migrated to the capacitor C2. Accordingly, the electric charge quantity of the capacitor C2 is given by, $$V_i + V_i + V_R = 2V_i + V_R$$

As explained in items B to D, three kinds of output voltages $V_o$ can be obtained by changing the connections of the switches S3 and S4. The feature of the present invention lies in the control of the switches S3 and S4.

Figure 8:
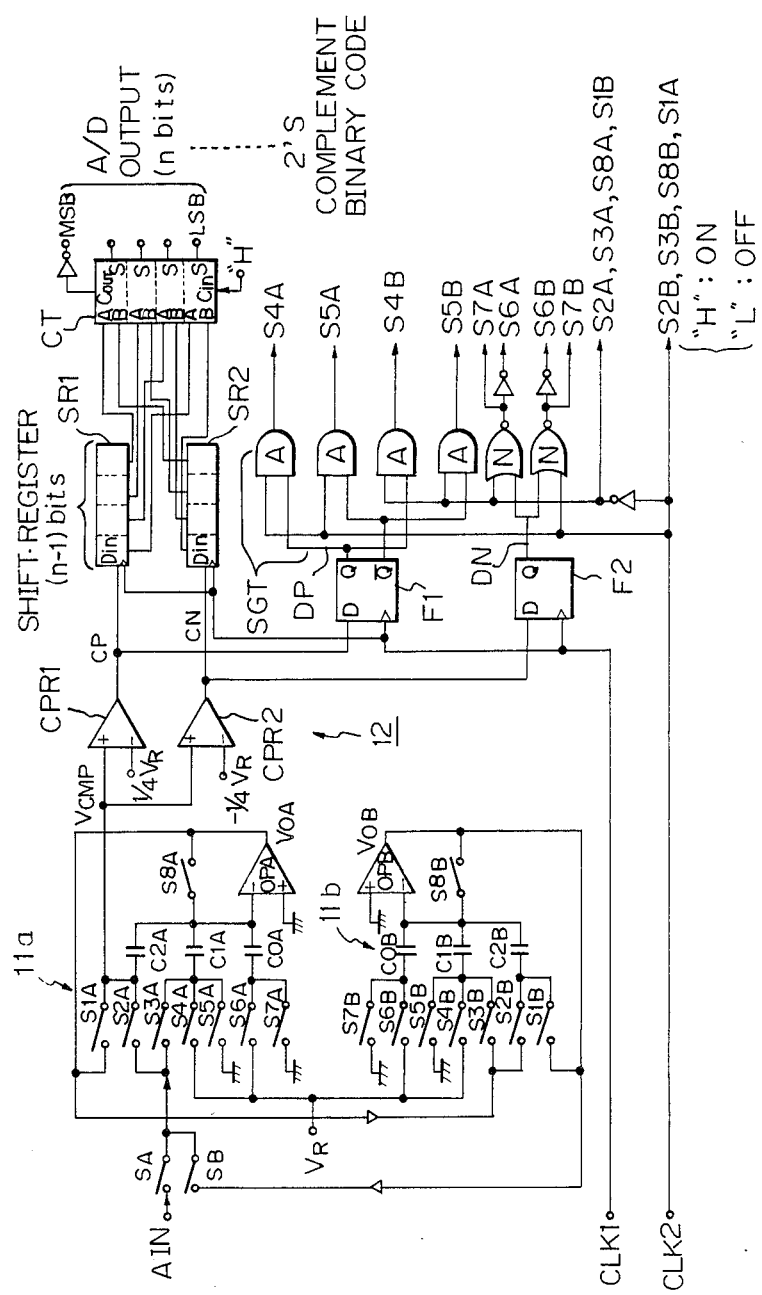
FIG. 8 is a schematic block diagram of an analog-to-digital conversion circuit according to an embodiment of the present invention.

Referring to FIG. 8, two of the circuits shown in FIGS. 7A to 7D are used as the voltage conversion block. That is, reference number 11a is the same as circuit 11b, AIN is an analog input signal, and CLK1 and CLK2 are clock signals. These signals are input from an external circuit (not shown). Switches SA and SB are input changing switches, S1A to S7A and S1B to S7B are also circuit changing switches, and S8A and S8B are mode changing switches. C0A to C2A and C0B to C2B are capacitors for conversion, and OPA and OPB are operational amplifiers. These elements correspond to those of FIGS. 7A to 7D. That is, switches S8A and S8B correspond to the switch S1; S1A, S2A and S1B, S2B correspond to the switch S2; S3A to S5A and S3B to S5B correspond to the switch S3, and S6A; S7A and S6B, S7B correspond to the switch S4.

Reference letters CPR1 and CPR2 are comparators, SR1 and SR2 are shift registers for series-to-parallel conversion and plus/minus code conversion, and CT is an adder. F1 and F2 are flip-flop circuits for latching output from the comparators, and SGT is a gate circuit constituted by AND gates A and NOR gates N. The switches shown in the circuit 11a and 11b are controlled by the outputs of these AND gates and NOR gates. When the output is high level, the corresponding switch is turned ON, and when the output is low level, the corresponding switch is turned OFF.

The operation of these circuits will be explained in detail with reference to FIG. 9.

Figure 9:
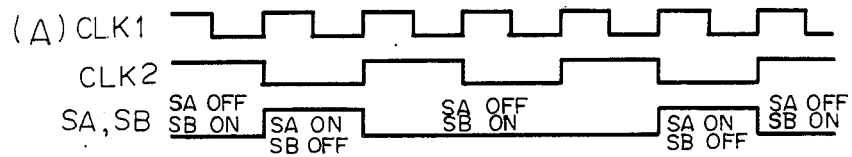
FIG. 9 is a chart for explaining the operation of circuits shown in FIG. 8.

In FIG. 9, section (A) represents waveforms of the clock signals CLK1 and CLK2 and the ON/OFF timing of the switches SA and SB. Section (B) represents the status of each switch and various signals. Reference numbers 1 to 4 in section (B) represent operation steps of the circuit shown in FIG. 8. Asterisks in the chart represent a value determined by depending on an input voltage AIN.

In step 1;

The connection configurations of the switches S1A to S8A are the same as that of FIG. 7A. That is, in this step, an input analog voltage AIN is taken into the circuit 11a through the switch SA. Accordingly, the sampling operation of the input analog voltage can be performed by this step. In this state, the capacitor C0A is charged by the reference voltage $V_R$, and the capacitors C1A and C2A are charged by the input voltage AIN (the same as $V_i$ mentioned before). Since the switch S2A is turned ON, the input voltage AIN is input to the comparators CPR1 and CPR2 as the voltage $V_{CMP}$. The voltage $V_{CMP}$ is compared with the decision level voltages $+V_R/4$ (in the comparator CPR1) and $-V_R/4$ (in the comparator CPR2).

Assuming that the input voltage AIN is $\frac{3}{8}$ (V), this voltage is larger than both decision level voltages $+\frac{1}{4}$ (V) and $-\frac{1}{4}$ (V) (in this case, the reference voltage $V_R$ is 1 (V). Accordingly, the comparator outputs CP and CN are high (H) level. The asterisks attached to both "H" levels of the CP and CN mean that these levels are decided when the input voltage is $\frac{3}{8}$ (V).

In Step 2;

The circuit 11a corresponds to FIG. 7B, and the circuit 11b corresponds to FIG. 7A in this step. When the switches S1A to S8A and S1B to S8B are connected as shown in the chart, the comparator output voltages CP and CN are output to the shift registers SR1, SR2 and the flip-flop circuits F1, F2. In this case, the output CP is input to the shift register SR1 and the flip-flop F1, and the output CN is input to the shift register SR2 and the flip-flop F2. The clock signal CLK2 is "H" level, and accordingly, the switches S2B, S3B, S8B and S1A are turned ON. Moreover, the clock signal CLK2 is input to each of the AND gates and NOR gates, then each of the switches is turned ON/OFF in correspondence with the "H" or "L" level of the gate output.

Accordingly, in this circuit 11a, the output voltage $V_{OA}$ of the operational amplifier OPA is obtained based on the formula $V_o = 2V_i - V_R$ as follows.

$$V_{OA} = 2 \times \tfrac{3}{8} - 1 = -\tfrac{1}{4} \text{ (V)}$$

where, AIN $(V_i) = \tfrac{3}{8}$ (V)

In the circuit 11b, the capacitor C0B is charged up by the reference voltage $V_R$, and the capacitors C1B and C2B are charged up by the output voltage $V_{OA}$ ($-\tfrac{1}{4}$ V) of the operational amplifier OPA. The output voltage $V_{OA}$ is input to both the comparators CPR1 and CPR2 as the input voltage $V_{CMP}$ through the switch S1A.

The voltage $V_{CMP}$ is compared with the decision level voltages $+V_R/4$ and $-V_R/4$. Since the reference voltage $V_R$ is 1 V, the decision level voltage become $+\tfrac{1}{4}$ and $-\tfrac{1}{4}$ (V). Therefore, $$+\tfrac{1}{4} > V_{CMP} = -\tfrac{1}{4} \geq -\tfrac{1}{4}$$

Accordingly, the output voltage CP is "L" level and the output voltage CN is "H" level. In this case, since the input voltage $V_i = \tfrac{3}{8}$ (V), the generated digit is given by "1".

In step 3;

The circuit 11a corresponds to FIG. 7A and the circuit 11b corresponds to FIG. 7C. When the switches S1A to S8A and S1B to S8B are connected as shown in the chart, the output voltages CP and CN which are obtained in step 2 are taken in to the shift registers SR1, SR2 and the flip-flops F1, F2, and processed as new voltages DP and DN.

In the circuit 11b, the output voltage $V_{OB}$ of the operational amplifier OPB is given as follows, based on the formula $V_o = 2V_i$.

$$V_{OB} = 2 \times (-\tfrac{1}{4}) = -\tfrac{1}{2}(V)$$

where, $V_i(-\tfrac{1}{4})$ is given by the previous output voltage $V_{OA}$ in step 2. The voltage $V_{OB}(=V_{CMP})$ is compared with the decision level voltages $+\tfrac{1}{4}$ and $-\tfrac{1}{4}$. As is obvious, both output voltages CP and CN become "L" level. Since the previous input voltage $V_i$ is $-\tfrac{1}{4}$ (V), the generated digit is given by "0".

In step 4;

The circuit 11a corresponds to FIG. 7D and the circuit 11b corresponds to FIG. 7A. When the switches S1A to S8A and S1B and S8B are connected as shown in the chart, the output voltages CP and CN, which are obtained in step 3, are taken in to the shift registers SR1, SR2 and the flip-flops F1, F2, and processed as new voltages DP and DN.

In the circuit 11a, the output voltage $V_{OA}$ of the operational amplifier OPA is given as follows, based on the formula $V_o = 2V_i + V_R$.

$$V_{OA} = 2 \times (-\tfrac{1}{2}) + 1 = 0 \, (V)$$

where, $V_i(-\tfrac{1}{2})$ is given by the previous output voltage $V_{OB}$ in step 3. The voltage $V_{OA}$ ($=V_{CMP}$) is compared with the decision level voltages. As a result, $$\tfrac{1}{4} > 0 > -\tfrac{1}{4}$$

Then, the output voltage CP is "L" level and the output voltage CN is "H" level. Since the previous input voltage $V_i$ is $-\tfrac{1}{2}$ (V), the generated digit is given by "−1". As is obvious from the next step, the generated digit in step 1 is obtained in the next conversion. That is, since $V_i$ is 0 (V), the generated digit is given by "0".

Consequently, the analog input voltage $\tfrac{3}{8}$ (V) is converted to the digits 1, 0, −1, 0. These digits are divided into two binary numbers by plus/minus code conversion as explained below.

Figure 10:
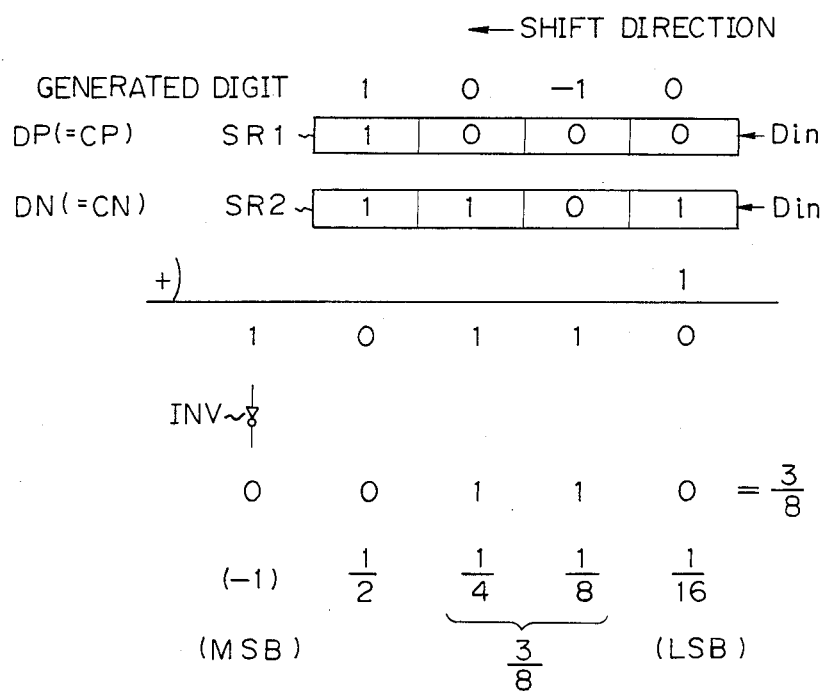
FIG. 10 is a view for explaining operation of the shift registers and an adder.

Referring to FIG. 10, the generated digits are shown by 1, 0, −1, 0. In the shift register SR1, plus code converted binary numbers 1, 0, 0, 0 are stored, and in the shift register SR2, minus code converted binary numbers 1, 1, 0, 1 are stored. In this case, the 2's complement binary code 0, 0, 1, 0 are applied to the shift register SR2. This is because both binary numbers stored in the SR1 and SR2 can be only added in the adder CT as explained below.

In the shift registers SR1 and SR2, the least significant bit (LSB) is on the right side, and the most significant bit (MSB) is on the left side. These values are added by the adder CT. The operation of the adder is explained in FIGS. 11 and 12. As is obvious from FIG. 10, although the digits stored in the SR1 and SR2 are given by four digits, five digits have occurred due to the carry of the MSB in the shift register SR1 and SR2. Accordingly, the fifth bit (=1) of the MSB is inverted to "0" by using the inverter INV. Consequently, a binary number 0 1 1 0 is obtained from the output of the adder CT as digital codes. This binary number is, of course, equal to the analog number $\tfrac{3}{8}$.

Figure 11:
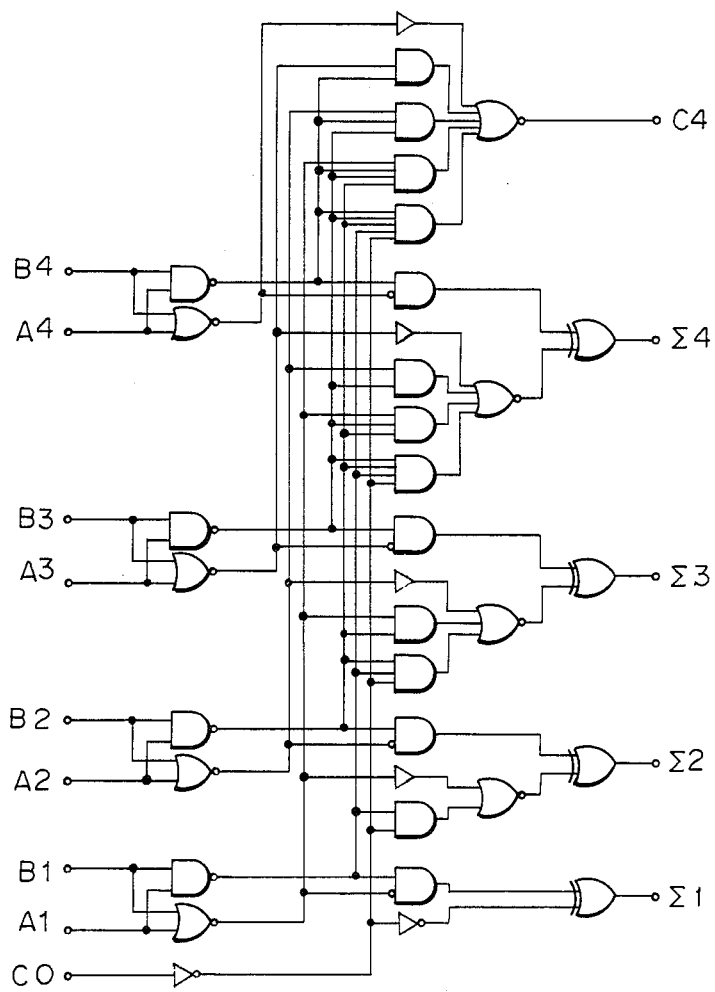
FIG. 11 is a partial circuit diagram of a conventional adder.

Referring to FIGS. 11 and 12, these circuit and function charts are of a well-known adder. This adder is the 4 bits binary full adder MODEL MB74LS283 made by Fujitsu Limited. For example, when the inputs A1, A2 are "H" level and the inputs B1, B2 are "L" level, outputs Σ1, Σ2 are "L" level when an input C0 is "H" level. When inputs A3, B3 are "L" level and inputs A4 and B4 are "H" level, outputs Σ3, Σ4 are "H" and "L" level when an input C0 is "H" level.

Figure 13:
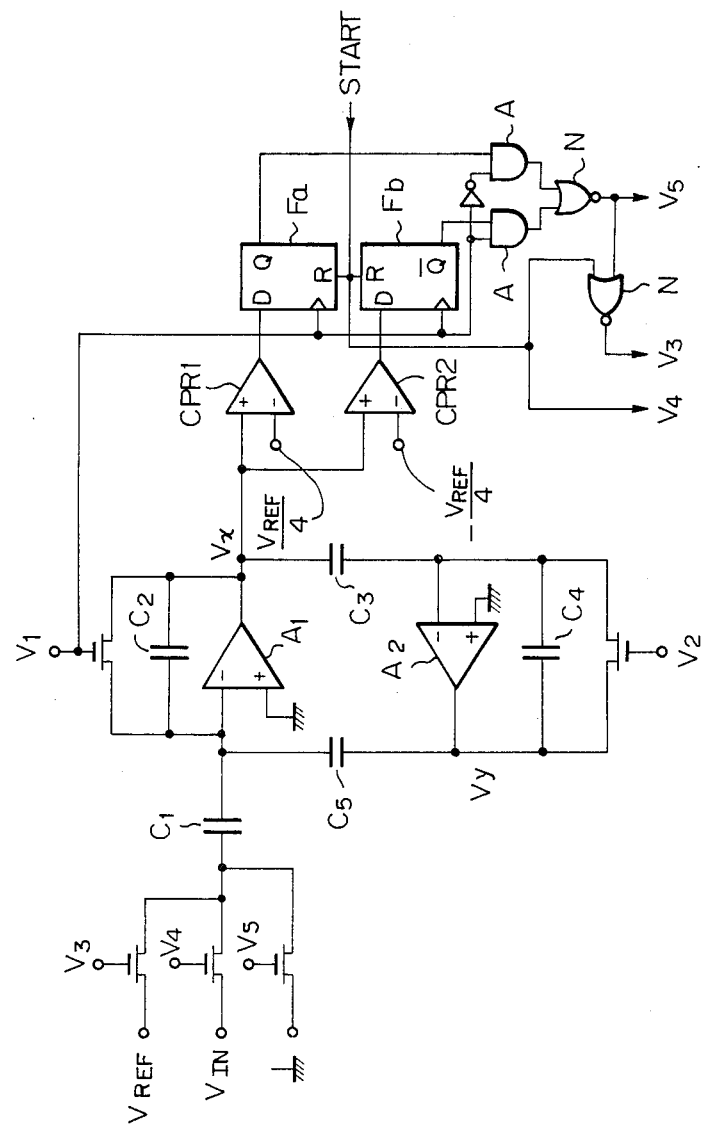
FIG. 13 is a schematic block diagram of an analog-to-digital conversion circuit according to another embodiment of the present invention.

Referring to FIG. 13, $A_1$ and $A_2$ are operational amplifiers. Capacitors $C_1$, $C_2$, $C_3$, and $C_4$ have equal capacitances and the capacitor $C_5$ has double the capacitance of the capacitor $C_1$. The control section is constituted by two comparators CPR1 and CPR2, two flip-flop circuits Fa and Fb, and gate circuits having two AND gates A and two NOR gates N. In this case, two operational amplifiers $A_1$ and $A_2$ and their peripheral circuit, except for the control section, are as in the conventional circuit. As explained below, a "three states control" is also possible by using a combination of the present and the conventional circuits.

Figure 14:
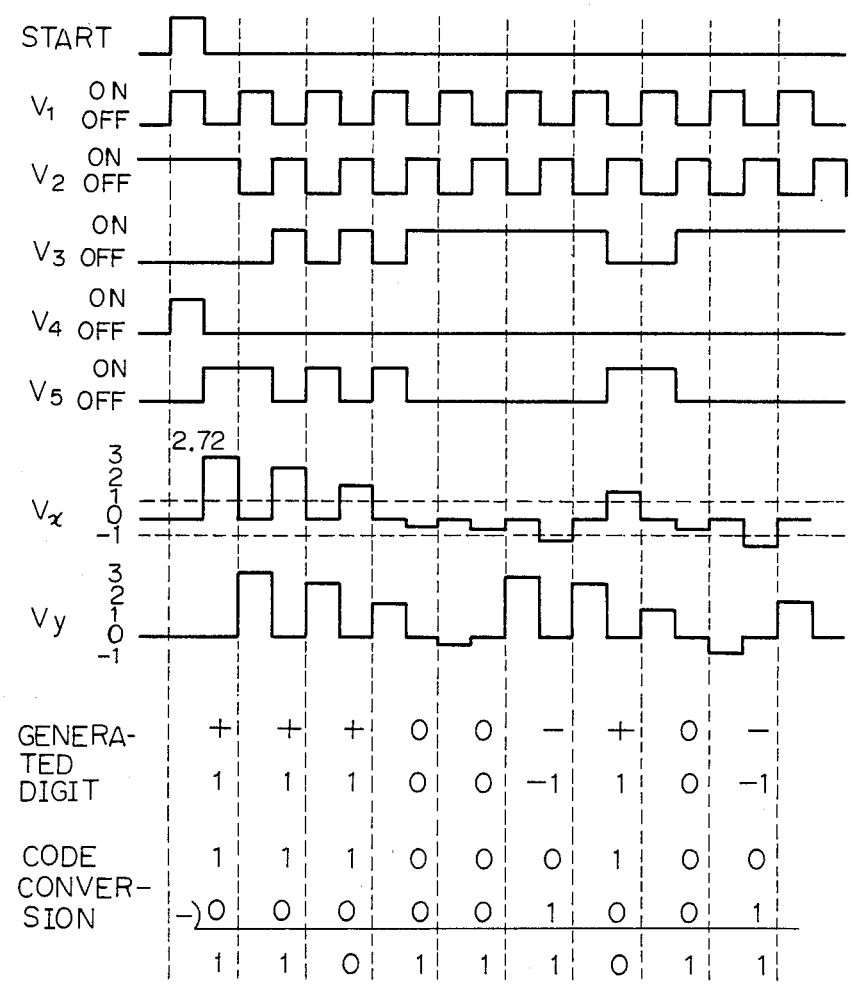
FIG. 14 is a timing chart of each voltage in the circuit shown in FIG. 13.

The operations of this circuit will be explained with reference to FIG. 14. Referring to FIG. 14, the input voltage $V_{IN}$ is 2.72 (V) and the reference voltage $V_{REF}$ is 3.14 (V). In this case, the two kinds of decision level voltages are set to $V_{REF}/4$ and $-V_{REF}/4$. Accordingly, the voltage $V_x$ is compared with these decision level voltages in the comparators OPR1 and OPR2. Three patterns of the outputs $V_3$ and $V_5$ of the control circuit are decided as shown in FIG. 15. That is, when the comparators OPR1 and OPR2 are "L" level, the voltage $V_3$ is changed from "H" level to "L" level and the voltage $V_5$ is changed from "L" level to "H" level. When the comparator OPR1 is "L" level and the comparator OPR2 is "H" level, the voltage $V_3$ is "H" level and the voltage $V_5$ is "L" level. When the comparators OPR1 and OPR2 are "H" level, the voltage $V_3$ is changed from "L" level to "H" level and the voltage $V_5$ is changed from "H" level to "L" level.

In FIG. 13, after the capacitor $C_1$ is charged by the input voltage $V_{IN}$, when the voltage $V_5$ becomes "H" level, the electric charge of the capacitor $C_1$ is transferred to the capacitor $C_2$. Consequently, the voltage $V_x$ becomes 2.71 (V) and this voltage $V_x$ is compared by the comparators CPR1 and CPR2. Moreover, the capacitor $C_3$ is also charged by the voltage $V_x$ since the voltage $V_2$ is "H" level.

When the voltage $V_1$ is "H" level and the voltage $V_2$ is "L" level, the electric charge of the capacitor $C_2$ is cleared and the electric charge of the capacitor $C_3$ is transferred to the capacitor $C_4$. Accordingly, the voltage $V_y$ is equal to the voltage $V_x$ mentioned above. since the capacitance of the capacitor $C_5$ is set to double the capacitance of the capacitor $C_1$, a double capacitance of the capacitor $C_2$ is charged to the capacitor $C_5$. Moreover, when the voltage $V_5$ is "H" level, the capacitor $C_1$ is connected to the ground based on the positive value of the resultant data of the voltage $V_x$. Next, when the voltage $V_1$ is "L" level and the voltage $V_2$ is "H" level, the voltage $V_5$ is "L" level and the voltage $V_3$ is "H" level. Moreover, when the electric charge of the capacitor $C_5$ is transferred to the capacitor $C_2$, the electric charge of the capacitor $C_1$ based on the voltage $V_R$ is subtracted from the capacitor $C_2$.

After this control, the generated digits are obtained as shown in FIG. 14. These digits are processed by plus/minus code conversion so that a binary number is obtained as shown in FIG. 14.

Referring to FIG. 16, these charts represent conversion range and output codes of the A/D and D/A changeable converter constituted by an integrated circuit (IC). Since the resolution rate is 16 bits, 1LSB becomes $V_R/2^{15}$. In FIG. 16, when the analog input voltage $V_i$ is zero volt, the output digital code is given by "0000–0000". When the analog input voltage $V_i$ is $V_R/2$ ($V_R$ is reference voltage as explained above), the output digital codes are given by "0100–0000". When the input voltage $V_i$ is $(+V_R\text{-1LSB})$ or is larger than $+V_R$, the output codes are given by "0111–1111".

I claim:

1. An analog-to-digital conversion system for converting an input analog voltage to binary coded digital data in dependence upon a reference voltage, said system comprising:
    voltage conversion means, operatively connected to receive an input voltage and the reference voltage, for generating one of three kinds of conversion voltages including—a first conversion voltage equal to double the input voltage, a second conversion voltage equal to the first conversion voltage plus the reference voltage and a third conversion voltage equal to the first conversion voltage minus the reference voltage, the input analog voltage being applied as the input voltage for an initial conversion cycle and the one of the three kinds of conversion voltages just generated being applied as the input voltage for each subsequent conversion cycle;
    comparison means, operatively connected to receive first and second decision level voltages, for comparing the input voltage with each of the decision level voltages and outputting an output signal having one of three predetermined values in accordance with the result of the comparison, the first and second decision level voltages having opposite signs and each having an absolute value less than half of the absolute value of the reference voltage;
    control means for controlling said voltage conversion means to generate a selected one of the three kinds of conversion voltages in accordance with the output signal from said comparison means; and
    calculation means for converting the output signal obtained in a series of cyclic conversions by said voltage conversion means and comparisons by said comparison means into binary coded digital data.

2. An analog-to-digital conversion system as claimed in claim 1, further comprising calculation means comprising:
    a shift register, operatively connected to said comparison means, for converting a series of code formed by each command signal into a parallel code and performing plus/minus code conversion to form resultant data; and
    an adder operatively connected to said shift register, for adding the resultant data of the plus/minus code conversion.

3. An analog-to-digital conversion system as claimed in claim 1, wherein said voltage conversion means comprises at least one voltage conversion block having an operational amplifier, three capacitors and four switches.

4. An analog-to-digital conversion system as claimed in claim 1, wherein said control means comprises at least one flip-flop circuit, four AND gates and two NOR gates for generating a high or low level signal in order to change connections of said switch contacts.

5. An analog-to-digital conversion system as claimed in claim 1, wherein the first and second decision levels have absolute values approximately equal to one-quarter of the absolute value of the reference voltage.

6. An analog-to-digital conversion method for converting an input voltage using cyclic conversion, comprising the steps of:
    (a) selectively obtaining a conversion voltage from among at least three kinds of conversion voltages, the at least three kinds of conversion voltages including a first conversion voltage equal to double the input voltage, a second conversion voltage equal to a reference voltage subtracted from the first conversion voltage and a third conversion voltage equal to the reference voltage added to the first conversion voltage in a voltage conversion circuit;
    (b) comparing the input voltage with at least two decision level voltages, each having an absolute value smaller than the absolute value of the reference voltage;
    (c) outputting a command signal, for selecting the conversion voltage as a result of said comparing, to the voltage conversion circuit;
    (d) outputting the conversion voltage selected in response to the command signal and produced in step (b);
    (e) changing connections of switch contacts provided in the voltage conversion circuit in dependence upon the command signal to replace the input voltage with the conversion voltage; and
    (f) obtaining digital codes using shift registers for code conversion and an adder for adding code converted digital data based upon the command signal produced in each cycle.

7. An analog-to-digital conversion method as claimed in claim 6, wherein the command signal has one of three values: −1, 0, and +1.

8. An analog-to-digital conversion method as claimed in claim 6, wherein the decision level voltages are a predetermined positive voltage and a symmetrical negative voltage.

9. An analog-to-digital conversion method as claimed in claim 8, wherein the predetermined positive voltage is equal to a quarter of the absolute value of the reference voltage and the predetermined negative voltage is equal to a quarter of the absolute value of the reference voltage times −1.

10. An analog-to-digital conversion method as claimed in claim 6, wherein the decision level voltages are applied from an external circuit.

11. An analog-to-digital conversion method as claimed in claim 7, wherein the three values (−1, 0 and +1) of the command signal are determined as follows—the command signal has the value "−1" when the conversion voltage is smaller than a predetermined negative voltage, the command signal has the value "0" when the conversion voltage is between a predetermined positive voltage and the predetermined negative voltage, and the command signal has the value "+1" when the conversion voltage is larger than the predetermined positive voltage.

12. An analog-to-digital conversion method as claimed in claim 8, wherein one of three values (−1, 0 and +1) is assigned to the command signal as follows—the command signal has the value "−1" when the conversion voltage is smaller than the predetermined negative voltage, the command signal has the value "0" when the conversion voltage is between the predetermined positive voltage and the predetermined negative voltage, and the command signal has the value "+1" when the conversion voltage is larger than the predetermined positive voltage.

13. An analog-to-digital conversion method as claimed in claim 9, wherein one of three values (−1, 0 and +1) is assigned to the command signal as follows—the command signal has the value "−1" when the conversion voltage is smaller than the predetermined negative voltage, the command signal has the value "0" when the conversion voltage is between the predetermined positive voltage and the predetermined negative voltage, and the command signal has the value "+1" when the conversion voltage is larger than the predetermined positive voltage.

14. An analog-to-digital conversion method for converting an input voltage using cyclic conversion, comprising the steps of:

(a) selectively obtaining a conversion voltage in one of at least three ways in dependence upon a command signal, the three ways including doubling the input voltage, doubling the input voltage and subtracting a reference voltage and doubling the input voltage and adding the reference voltage;

(b) comparing the input voltage with at least two decision level voltages to produce the command signal indicating how the input and decision level voltages compare, each decision level voltage having an absolute value smaller than the absolute value of the reference voltage;

(c) replacing the input voltage with the conversion voltage selected in response to the command signal produced in step (b); and (d) repeating steps (a)-(c) for a predetermined number of cycles and obtaining a digital code from the command signal produced in all of the cycles.

15. An analog-to-digital conversion method as claimed in claim 14, wherein the absolute value of each decision level voltage is less than one-half of the absolute value of the reference voltage.

16. An analog-to-digital conversion method as claimed in claim 15, wherein the absolute value of each decision level voltage is approximately one-quarter of the absolute value of the reference voltage.

* * * * *

UNITED STATES PATENT AND TRADEMARK OFFICE
CERTIFICATE OF CORRECTION

PATENT NO. : 4,748,440

DATED : May 31, 1988

INVENTOR(S) : OSAMU KOBAYASHI

It is certified that error appears in the above-identified patent and that said Letters Patent is hereby corrected as shown below:

Column 8, line 21, "that" should be --That--.

Column 11, line 37, "-1 1/4" should be -- -1/4 --.

Signed and Sealed this

Sixth Day of December, 1988

Attest:

DONALD J. QUIGG

Attesting Officer

Commissioner of Patents and Trademarks